United States Patent
Baik et al.

(10) Patent No.: US 7,695,989 B2
(45) Date of Patent: Apr. 13, 2010

(54) METHOD OF MANUFACTURING VERTICAL GALLIUM-NITRIDE BASED LIGHT EMITTING DIODE

(75) Inventors: Doo Go Baik, Suwon (KR); Bang Won Oh, Seongnam (KR); Seok Beom Choi, Daejeon (KR); Su Yeol Lee, Seongnam (KR)

(73) Assignee: Samsung Electro-Mechanics Co., Ltd., Gyunggi-do (KR)

( * ) Notice: Subject to any disclaimer, the term of this patent is extended or adjusted under 35 U.S.C. 154(b) by 0 days.

(21) Appl. No.: 12/406,540

(22) Filed: Mar. 18, 2009

(65) Prior Publication Data

US 2009/0181485 A1      Jul. 16, 2009

Related U.S. Application Data

(62) Division of application No. 11/634,112, filed on Dec. 6, 2006, now Pat. No. 7,573,076.

(30) Foreign Application Priority Data

Dec. 6, 2005  (KR) .................. 10-2005-0117958

(51) Int. Cl.
*H01L 21/00* (2006.01)
(52) U.S. Cl. .............. 438/22; 438/29; 438/69; 257/103; 257/E21.018

(58) Field of Classification Search ............ 438/22, 438/69, 29; 257/103, E21.018, E21.022
See application file for complete search history.

(56) References Cited

U.S. PATENT DOCUMENTS

| 4,854,975 | A | 8/1989 | Krause |
| 5,017,243 | A * | 5/1991 | Otsubo .................. 136/244 |
| 7,517,465 | B2 * | 4/2009 | Guha et al. ................ 216/24 |
| 2003/0116770 | A1 | 6/2003 | Chang et al. |
| 2007/0114564 | A1 | 5/2007 | Lee et al. |

FOREIGN PATENT DOCUMENTS

| JP | 08-116088 | 5/1996 |
| JP | 2001-168390 | 6/2001 |

* cited by examiner

*Primary Examiner*—Phuc T Dang
(74) *Attorney, Agent, or Firm*—McDermott Will & Emery LLP

(57) ABSTRACT

A vertical GaN-based LED and a method of manufacturing the same are provided. The vertical GaN-based LED can prevent the damage of an n-type GaN layer contacting an n-type electrode, thereby stably securing the contact resistance of the n-electrode. The vertical GaN-based LED includes: a support layer; a p-electrode formed on the support layer; a p-type GaN layer formed on the p-electrode; an active layer formed on the p-type GaN layer; an n-type GaN layer for an n-type electrode contact, formed on the active layer; an etch stop layer formed on the n-type GaN layer to expose a portion of the n-type GaN layer; and an n-electrode formed on the n-type GaN layer exposed by the etch stop layer.

6 Claims, 4 Drawing Sheets

[FIG. 1A] PRIOR ART
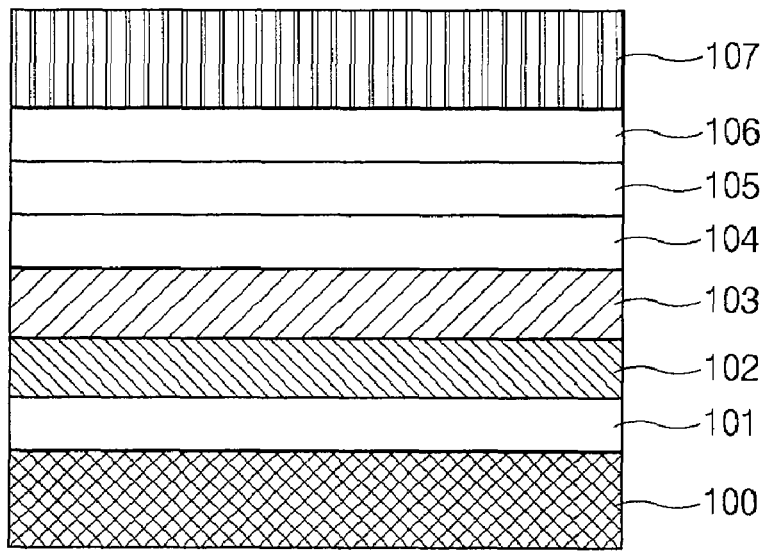
[FIG. 1B] PRIOR ART
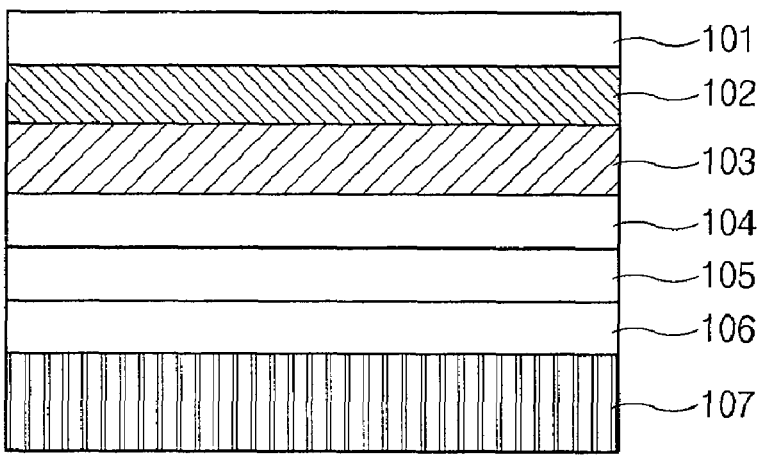
[FIG. 1C] PRIOR ART
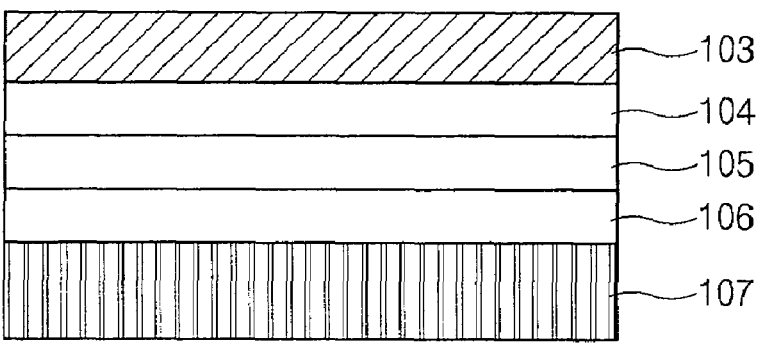

[FIG. 1D] PRIOR ART
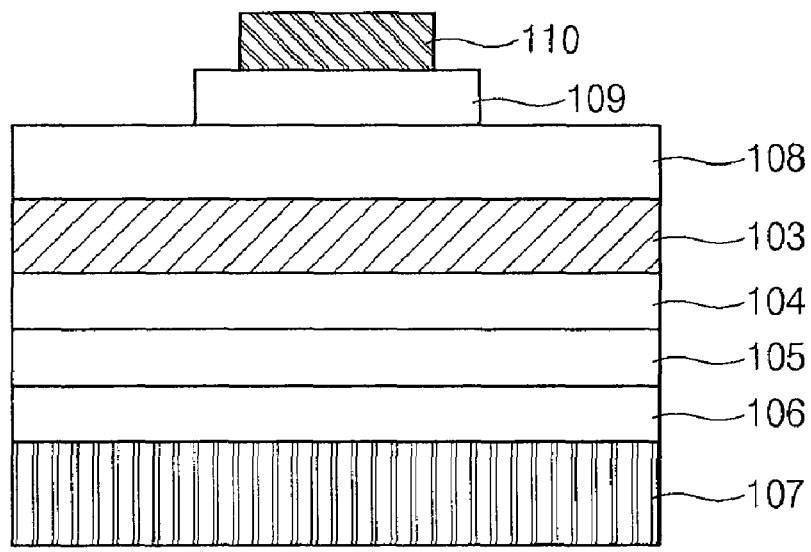
[FIG. 2] PRIOR ART
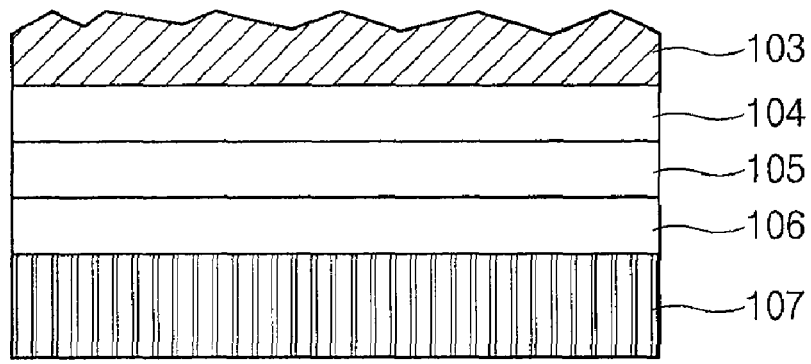
[FIG. 3]
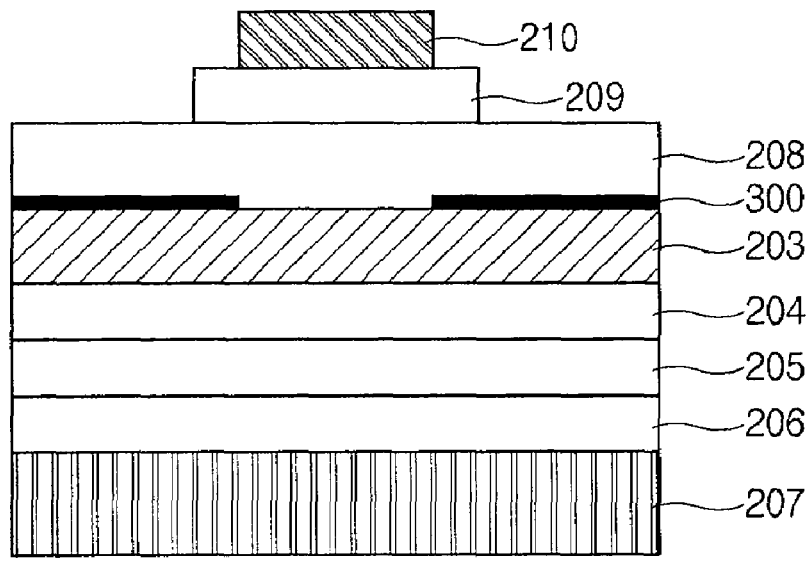

[FIG. 4]
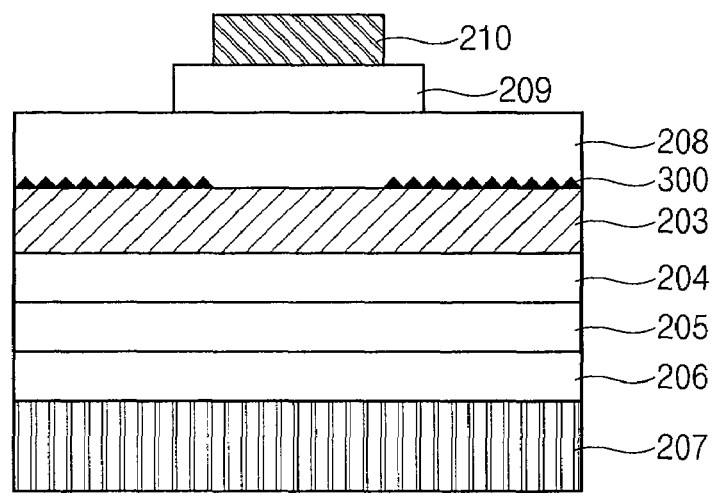
[FIG. 5A]
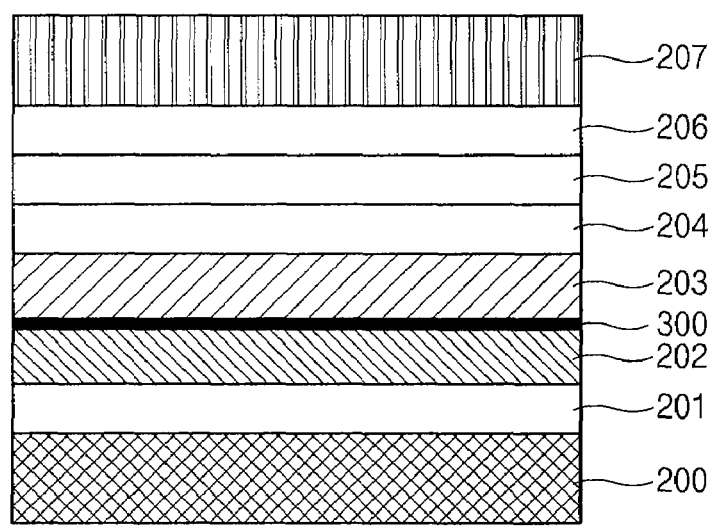
[FIG. 5B]
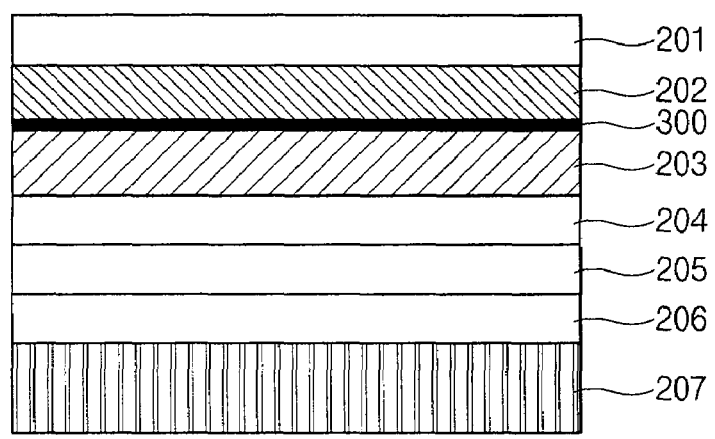

[FIG. 5C]
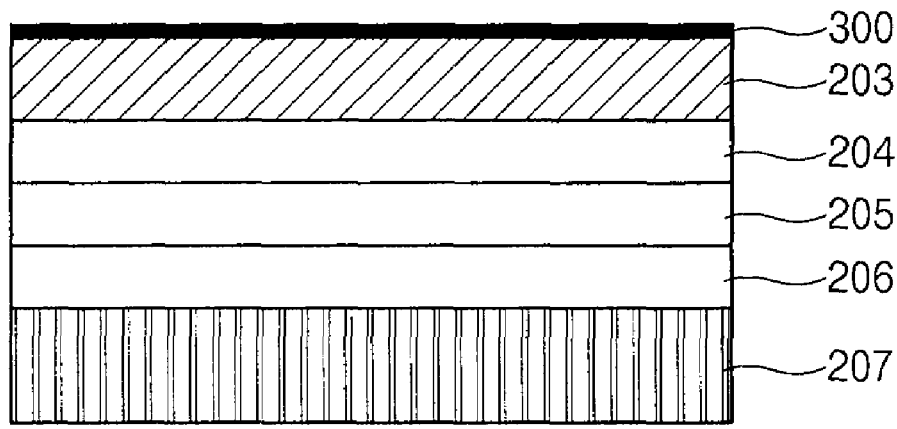
[FIG. 5D]
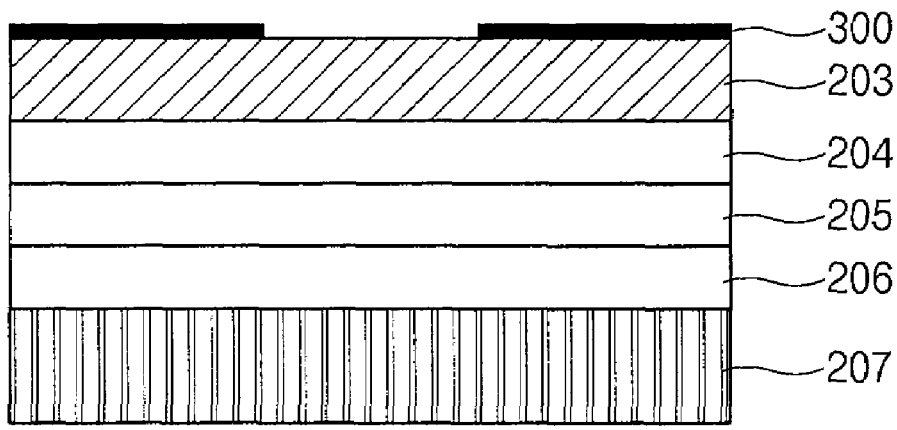
[FIG. 5E]
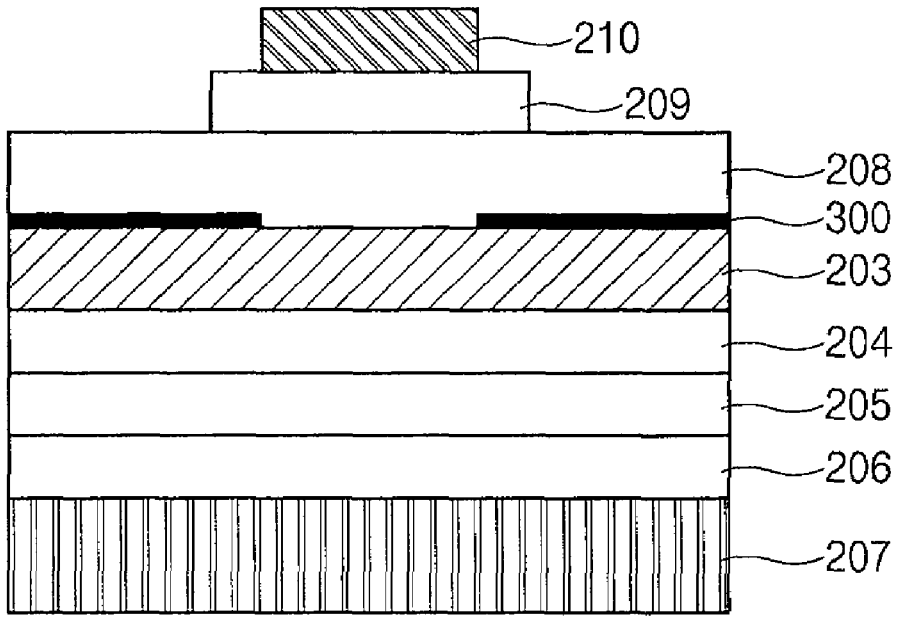

METHOD OF MANUFACTURING VERTICAL GALLIUM-NITRIDE BASED LIGHT EMITTING DIODE

CROSS-REFERENCE TO RELATED APPLICATIONS

This application is a Divisional of U.S. application Ser. No. 11/634,112, filed Dec. 6, 2006, U.S. Pat. No. 7,573,076, claiming priority of Korean Patent Application No. 10-2005-0117958, filed Dec. 6, 2005, the entire contents of each of which are hereby incorporated by reference.

BACKGROUND OF THE INVENTION

1. Field of the Invention

The present invention relates to a vertical gallium-nitride (GaN)-based light emitting diode (LED), and more particularly, to a vertical GaN-based LED that can prevent the damage of an n-type GaN layer contacting an n-electrode. Thus, the vertical GaN-based LED can stably secure the contact resistance of the n-electrode, reduce the operating voltage, and improve the luminous efficiency.

2. Description of the Related Art

Generally, GaN-based LEDs are grown on a sapphire substrate. The sapphire substrate is rigid and electrically nonconductive and has a low thermal conductivity. Therefore, it is difficult to reduce the size of the GaN-based LED for cost-down or improve the optical power and chip characteristics. Particularly, heat dissipation is very important for the LEDs because a high current should be applied to the GaN-based LEDs so as to increase the optical power of the GaN-based LEDs.

To solve these problems, a vertical GaN-based LED has been proposed. In the vertical GaN-based LED, the sapphire substrate is removed using a laser lift-off (hereinafter, referred to as LLO) technology.

A method of manufacturing a vertical GaN-based LED according to the related art will be described below with reference to FIGS. 1A to 1D.

FIGS. 1A to 1D are sectional views illustrating a method of manufacturing a vertical GaN-based LED according to the related art.

Referring to FIG. 1A, an undoped GaN layer 101 and a lightly doped n-type GaN layer 102 are sequentially grown on a sapphire substrate 100. A heavily doped n-type GaN layer (that is, an n-type GaN layer 103 for an n-type electrode contact), a GaN/InGaN active layer 104 with a multi-quantum well structure, and a p-type GaN layer 105 are sequentially grown on the lightly doped n-type GaN layer 102. Then, a p-electrode 106 is formed on the p-type GaN layer 105.

A plating seed layer (not shown) is formed on the p-electrode 106. A support layer 107 is formed on the plating seed layer by electrolyte plating or electroless plating. The plating seed layer serves as a plating crystal nucleus when the plating process is performed for forming the support layer 107. The support layer 107 supports the final LED structure and serves as an electrode.

Referring to FIG. 1B, the sapphire substrate 100 is removed using an LLO process.

Referring to FIG. 1C, the undoped GaN layer 101 and the lightly doped n-type GaN layer 102 exposed by the process of removing the sapphire substrate 100 are removed to expose the n-type GaN layer 103 for the n-type electrode contact. By removing the undoped GaN layer 101 and the lightly doped n-type GaN layer 102, the n-type GaN layer 103 (that is, the heavily doped n-type GaN layer) contacts an n-electrode 110, which will be formed later. Therefore, the contact resistance of the n-electrode 110 is reduced and the operating voltage is reduced. The removing process may be achieved by a general etching process.

Referring to FIG. 1D, an n-electrode 110 is formed on the exposed n-type GaN layer 103. Prior to the formation of the n-electrode 110 on the n-type GaN layer 103, an n-type transparent electrode 108 for improving the current spreading effect and an n-type reflective electrode 109 for improving the light efficiency may be sequentially formed on the n-type GaN layer 103.

However, the method of manufacturing the vertical GaN-based LED according to the related art has the following problems. FIG. 2 is a sectional view for explaining the problems of the related art.

When etching the undoped GaN layer 101 and the lightly doped n-type GaN layer 102 exposed by the removal of the sapphire substrate 100, there is almost no difference of the etching selectivity in the lightly doped n-type GaN layer 102 and the n-type GaN layer 103 and thus the surface of the n-type GaN layer 103 is partially etched as illustrated in FIG. 2. Therefore, the entire thickness and surface state of the n-type GaN layer 103 are not uniform. Furthermore, if the n-type transparent electrode 108 or the n-electrode 110 are formed on the n-type GaN layer 103 whose surface is damaged, the contact resistance and the operating voltage of the electrode contacting the n-type GaN layer 103 is increased, resulting in the degradation of the luminous efficiency.

SUMMARY OF THE INVENTION

An advantage of the present invention is that it provides a vertical GaN-based LED that can prevent the damage of an n-type GaN layer contacting an n-electrode. Thus, the vertical GaN-based LED can stably secure the contact resistance of the n-electrode, reduce the operating voltage, and improve the luminous efficiency.

Additional aspects and advantages of the present general inventive concept will be set forth in part in the description which follows and, in part, will be obvious from the description, or may be learned by practice of the general inventive concept.

According to an aspect of the invention, a vertical GaN-based LED includes: a support layer; a p-electrode formed on the support layer; a p-type GaN layer formed on the p-electrode; an active layer formed on the p-type GaN layer; an n-type GaN layer for an n-type electrode contact, formed on the active layer; an etch stop layer formed on the n-type GaN layer to expose a portion of the n-type GaN layer; and an n-electrode formed on the n-type GaN layer exposed by the etch stop layer.

According to another aspect of the present invention, the etch stop layer is formed of material having an etching selectivity different from that of the n-type GaN layer.

According to a further aspect of the present invention, the etch stop layer is formed of at least one material selected from the group consisting of group III-V semiconductor compounds, group III-VI semiconductor compounds, and group III-VII semiconductor compounds.

According to a still further aspect of the present invention, the etch stop layer has an uneven surface.

According to a still further aspect of the present invention, the vertical GaN-based LED further includes an n-type transparent electrode and an n-type reflective electrode sequentially formed between the n-type GaN layer including the etch stop layer and the n-electrode.

According to a still further aspect of the present invention, a method of manufacturing a vertical GaN-based LED includes: sequentially forming an undoped GaN layer, a lightly doped n-type GaN layer, an etch stop layer, an n-type GaN layer for an n-type electrode contact, an active layer, and a p-type GaN layer on a sapphire substrate; forming a p-electrode on the p-type GaN layer; forming a support layer on the p-electrode; removing the sapphire substrate using a laser lift-off (LLO) process; etching the undoped GaN layer and the lightly doped n-type GaN layer; selectively etching the etch stop layer to expose at least a portion of the n-type GaN layer; and forming an n-electrode on the exposed n-type GaN layer.

According to a still further aspect of the present invention, the lightly doped n-type GaN layer has a doping concentration of $10^{-8}$E or less.

According to a still further aspect of the present invention, the etch stop layer is formed of material having an etching selectivity different from that of the lightly doped n-type GaN layer and the n-type GaN layer.

According to a still further aspect of the present invention, the etch stop layer is formed of at least one material selected from the group consisting of group III-V semiconductor compounds, group III-VI semiconductor compounds, and group III-VII semiconductor compounds.

According to a still further aspect of the present invention, the method further includes forming the remaining etch stop layer to have an uneven surface after the selective etching of the etch stop layer.

According to a still further aspect of the present invention, the method further includes sequentially forming an n-type transparent electrode and an n-type reflective electrode on the etch stop layer and the n-type GaN layer prior to the formation of the n-type electrode.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIGS. 1A to 1D are sectional views illustrating a method of manufacturing a vertical GaN-based LED according to the related art;

FIG. 2 is a sectional view for explaining the problems of the related art;

FIGS. 3 and 4 are sectional views of a vertical GaN-based LED according to an embodiment of the present invention; and FIGS. 5A to 5E are sectional views illustrating a method of manufacturing a vertical GaN-based LED according to an embodiment of the present invention.

DETAILED DESCRIPTION OF THE PREFERRED EMBODIMENTS

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures. In the drawings, the thicknesses of layers and regions are exaggerated for clarity.

Structure of Vertical GaN-Based LED

FIGS. 3 and 4 are sectional views of a vertical GaN-based LED according to an embodiment of the present invention.

Referring to FIG. 3, a support layer 207 is formed in the lowermost portion of the vertical GaN-based LED. The support layer 207 supports the LED and serves as an electrode.

A plating seed layer (not shown) and a p-electrode 206 are sequentially formed on the support layer 207. A p-type GaN layer 205 and a GaN/InGaN active layer 204 with a multi-quantum well structure are sequentially formed on the p-electrode 206. It is preferable that the p-electrode 206 is formed of a metal having high reflectivity so that it can serve as both an electrode and a reflection plate. In addition, light is emitted from the active layer 204. Generally, the active layer 204 is grown to a thickness of about 1,000 Å at a temperature of 700-900° C. An n-type GaN layer 203 for an n-type electrode contact is formed on the active layer 204. An etch stop layer 300 exposing a portion of the n-type GaN layer 203 is formed on the n-type GaN layer 203.

The etch stop layer 300 is formed of material having an etching selectivity different from that of the n-type GaN layer 203. It is preferable that the etch stop layer 300 is formed of at least one material selected from the group consisting of groups III-V semiconductor compounds, group III-VI semiconductor compounds, and group III-VII semiconductor compounds.

An n-type transparent electrode 208 for improving the current spreading effect and an n-type reflective electrode 209 for improving the light efficiency are sequentially formed on the etch stop layer 300 and the n-type GaN layer 203. An n-electrode 210 is formed on the n-type reflective electrode 209. The formation of the n-type transparent electrode 208 and the n-type reflective electrode 209 may be omitted. In this case, the n-electrode 210 may be formed such that it directly contacts the n-type GaN layer 203 exposed by the etch stop layer 300.

As illustrated in FIG. 4, the etch stop layer 300 may have an uneven profile. In this case, light emitted from the active layer 204 is scattered at several angles by the uneven surface of the etch stop layer 300, thus increasing the luminous efficiency of the LED.

Method of Manufacturing Vertical GaN-Based LED

Hereinafter, a method of manufacturing a vertical GaN-based LED according to an embodiment of the present invention will be described in detail.

FIGS. 5A to 5E are sectional views illustrating a method of manufacturing a vertical GaN-based LED according to an embodiment of the present invention.

Referring to FIG. 5A, an undoped GaN layer 201 and a lightly doped n-type GaN layer 202 are sequentially grown on a sapphire substrate 200. It is preferable that the lightly doped n-type GaN layer 202 has a doping concentration of $10^{-18}$ E or less. An etch stop layer 300, a heavily doped n-type GaN layer 203 for an n-type electrode contact, a GaN/InGaN active layer 204 with a multi-quantum well structure, and a p-type GaN layer 205 are sequentially formed on the lightly doped n-type GaN layer 202. The etch stop layer 300 is formed of material having an etching selectivity different from those of the lightly doped n-type GaN layer 202 and the n-type GaN layer 203. It is preferable that the etch stop layer 300 is formed of at least one material selected from the group consisting of groups III-V semiconductor compounds, group III-VI semiconductor compounds, and group III-VII semiconductor compounds.

A p-electrode 106 and a plating seed layer (not shown) are sequentially formed on the p-type GaN layer 205. A support layer 207 is formed on the plating seed layer by electrolyte plating or electroless plating. The plating seed layer serves as a plating crystal nucleus when the plating process is performed for forming the support layer 207. In addition, the support layer 207 supports the final LED structure and serves as an electrode.

Although the support layer 207 is provided with the plating layer formed using the plating seed layer as the crystal nucleus, the present invention is not limited to the plating layer. The support layer 207 may be formed of a Si substrate, a GaAs substrate, a Ge substrate, or a metal layer. Moreover, the metal layer may be formed using a thermal evaporator, an e-beam evaporator, a sputter, a chemical vapor deposition (CVD), and so on.

Referring to FIG. 5B, the sapphire substrate 200 is removed using an LLO process.

Referring to FIG. 5C, the undoped GaN layer 201 and the lightly doped n-type GaN layer 202 exposed by the process of removing the sapphire substrate 200 are etched. In this embodiment, the etch stop layer 300 having an etching selectivity different from that of the lightly doped n-type GaN layer 202 is provided under the lightly doped n-type GaN layer 202. This etch stop layer 300 can prevent the n-type GaN layer 203 from being damaged during the process of etching the undoped GaN layer 201 and the lightly doped n-type GaN layer 202.

Referring to FIG. 5D, the etch stop layer 300 is selectively etched to expose at least a portion of the n-type GaN layer 203.

That is, a portion of the etch stop layer 300 may be etched to expose a portion of the n-type GaN layer 203, or the entire etch stop layer 300 may be etched to expose the entire n-type GaN layer 203. In the former case, the etch stop layer 300 is etched to expose a region of the n-type GaN layer 203 corresponding to a region where an n-electrode 210 will be formed later.

Because the etch stop layer 300 has the etching selectivity different from that of the n-type GaN layer 203, only the etch stop layer 300 can be selectively etched without damage of the n-type GaN layer 203.

As illustrated in FIG. 4, after the process of selectively etching the etch stop layer 300, the remaining etch stop layer 300 may have an uneven surface. In this case, light emitted from the active layer 204 so as to reach the etch stop layer 300 is scattered in several directions, thus increasing the luminous efficiency of the LED.

Referring to FIG. 5E, an n-type transparent electrode 208 for improving the current spreading effect and an n-type reflective electrode 209 for improving the light efficiency are sequentially formed on the etch stop layer 300 and the n-type GaN layer 203. Then, an n-electrode 210 is formed on the n-type reflective electrode 209.

The process of forming the n-type transparent electrode 208 and the n-type reflective electrode 209 can be omitted. In this case, the n-electrode 210 may be formed such that it directly contacts the n-type GaN layer 203 exposed by the remaining etch stop layer 300.

As described above, the etch stop layer 300 having a different etching selectivity different from the lightly doped n-type GaN layer 202 and the n-type GaN layer 203 is further formed therebetween. Therefore, the etch stop layer 300 can prevent the n-type GaN layer 203 from being removed or removed during the process of etching the lightly doped n-type GaN layer 202.

Consequently, the present invention can stably secure the contact resistance of the n-type transparent electrode 208 or the n-electrode 210 formed on the n-type GaN layer 203 and can reduce the operating voltage.

Moreover, by forming the etch stop layer 300 to have the uneven surface, the light that is emitted from the active layer 204 and reaches the etch stop layer 300 is scattered in several directions, thus increasing the luminous efficiency of the LED.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A method of manufacturing a vertical GaN-based LED, comprising:
   sequentially forming an undoped GaN layer, a lightly doped n-type GaN layer, an etch stop layer, an n-type GaN layer for an n-type electrode contact, an active layer, and a p-type GaN layer on a sapphire substrate;
   forming a p-electrode on the p-type GaN layer;
   forming a support layer on the p-electrode;
   removing the sapphire substrate using a laser lift-off (LLO) process;
   etching the undoped GaN layer and the lightly doped n-type GaN layer;
   selectively etching the etch stop layer to expose at least a portion of the n-type GaN layer for the n-type electrode contact; and
   forming an n-electrode on the exposed n-type GaN layer for the n-type electrode contact.

2. The method according to claim 1, wherein the lightly doped n-type GaN layer has a doping concentration of $10^{-8}$ E or less.

3. The method according to claim 1, wherein the etch stop layer is formed of material having an etching selectivity different from those of the lightly doped n-type GaN layer and the n-type GaN layer for the n-type electrode contact.

4. The method according to claim 3, wherein the etch stop layer is formed of at least one material selected from the group consisting of group III-V semiconductor compounds, group III-VI semiconductor compounds, and group III-VII semiconductor compounds.

5. The method according to claim 1, further comprising:
   after the selective etching of the etch stop layer, forming the remaining etch stop layer to have an uneven surface.

6. The method according to claim 1, further comprising:
   prior to the formation of the n-type electrode, sequentially forming an n-type transparent electrode and an n-type reflective electrode on the etch stop layer and the n-type GaN layer for the n-type electrode contact.

* * * * *